(12) United States Patent
He et al.

(10) Patent No.: US 11,545,786 B2
(45) Date of Patent: Jan. 3, 2023

(54) CABLE SHIELD FOR AN ELECTRICAL CONNECTOR

(71) Applicant: TE Connectivity Services GmbH, Schaffhausen (CH)

(72) Inventors: Yujie He, Harrisburg, PA (US); Bruce Allen Champion, Camp Hill, PA (US); Jeff Swartzbaugh, Dover, PA (US); James Charles Shiffer, Hershey, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 0 days.

(21) Appl. No.: 17/326,566

(22) Filed: May 21, 2021

(65) Prior Publication Data
US 2022/0376441 A1 Nov. 24, 2022

(51) Int. Cl.
*H01R 13/6471* (2011.01)
*H01R 13/6588* (2011.01)
*H05K 1/11* (2006.01)
*H01R 12/72* (2011.01)
*H01R 13/6592* (2011.01)

(52) U.S. Cl.
CPC ....... *H01R 13/6471* (2013.01); *H01R 12/721* (2013.01); *H01R 13/6588* (2013.01); *H01R 13/6592* (2013.01); *H05K 1/117* (2013.01)

(58) Field of Classification Search
CPC ........ H01R 13/65912; H01R 13/65914; H01R 13/65915; H01R 13/65918; H01R 13/6594; H01R 13/6471; H01R 13/6591; H01R 13/6592; H01R 13/6588; H01R 13/6596; H01R 12/721; H01R 12/718; H01R 12/75; H01R 12/79; H01R 12/712; H01R 12/714; H01R 12/62; H01R 9/0515; H05K 1/117
USPC ...... 439/607.35, 607.36, 607.28, 98, 92, 95, 439/101, 581, 579, 607.41, 607.44, 439/607.42, 607.43
See application file for complete search history.

(56) References Cited

U.S. PATENT DOCUMENTS 6,338,653 B1 * 1/2002 Jones .................... H01R 12/598
439/579
6,380,485 B1 * 4/2002 Beaman ............. H01R 13/6589
439/497

(Continued)

FOREIGN PATENT DOCUMENTS

TW  202109980 A * 3/2021 ........... H01R 12/596
WO  WO-2021144726 A1 * 7/2021 ............. H01B 11/08

*Primary Examiner* — Marcus E Harcum

(57) ABSTRACT

A cable card assembly includes a circuit card having a substrate including mating pads at a mating end and cable pads at a cable end. The circuit card has a ground plane. Cables are terminated to the circuit card at the cable end each having signal conductors, an insulator surrounding the signal conductors, and a ground conductor surrounding the insulator. Cable shields are terminated to the ground plane providing electrical shielding for the corresponding cables. Each cable shield includes an end wall between first and second side walls to form a cable cavity. The end wall has a connecting portion between the first and second side walls and a shroud portion extending from the connecting portion covering a portion of the ground conductor. The shroud portion is curved to follow a curvature of the ground conductor and extend along opposite sides of the ground conductor.

20 Claims, 6 Drawing Sheets

(56) References Cited

U.S. PATENT DOCUMENTS

| | | | | |
|---|---|---|---|---|
| 8,047,865 B2* | 11/2011 | Patel | H01R 13/6592 | |
| | | | 439/466 | |
| 8,840,432 B2* | 9/2014 | Alden, III | H01R 9/0515 | |
| | | | 439/607.46 | |
| 9,035,183 B2* | 5/2015 | Kodama | H05K 1/18 | |
| | | | 439/579 | |
| 9,203,193 B2* | 12/2015 | Hackman | H01R 13/648 | |
| 9,373,915 B1* | 6/2016 | Schulz | H01R 13/6461 | |
| 9,437,949 B2 | 9/2016 | Behziz et al. | | |
| 9,490,588 B2* | 11/2016 | Keyser | H01R 13/6595 | |
| 10,170,862 B2* | 1/2019 | Weidner | H01R 13/665 | |
| 10,304,592 B1* | 5/2019 | Hornung | H01R 13/6592 | |
| 10,411,374 B2* | 9/2019 | Tanaka | H01R 12/53 | |
| 10,498,085 B2* | 12/2019 | Dill, III | H01R 13/629 | |
| 10,535,956 B2* | 1/2020 | Henry | H01R 13/582 | |
| 11,125,958 B2* | 9/2021 | Champion | G02B 6/428 | |
| 11,245,210 B2* | 2/2022 | Ratkovic | H01R 12/62 | |
| 2006/0234556 A1* | 10/2006 | Wu | H01R 12/721 | |
| | | | 439/607.05 | |
| 2007/0155217 A1* | 7/2007 | Wu | H01R 13/512 | |
| | | | 439/353 | |
| 2011/0306244 A1* | 12/2011 | Zhang | H01R 13/65914 | |
| | | | 439/624 | |
| 2012/0061140 A1* | 3/2012 | Nonen | H05K 3/3405 | |
| | | | 29/843 | |
| 2013/0005178 A1* | 1/2013 | Straka | H01R 13/65914 | |
| | | | 439/497 | |
| 2013/0072041 A1* | 3/2013 | Nonen | H01R 13/65915 | |
| | | | 439/98 | |
| 2013/0188325 A1* | 7/2013 | Garman | H05K 9/0007 | |
| | | | 29/829 | |
| 2014/0138154 A1* | 5/2014 | Sugiyama | H01R 13/00 | |
| | | | 29/857 | |
| 2014/0154927 A1* | 6/2014 | Nonen | H01R 13/65917 | |
| | | | 29/857 | |
| 2014/0154928 A1* | 6/2014 | Nonen | H01R 13/65914 | |
| | | | 29/857 | |
| 2015/0111402 A1* | 4/2015 | Hackman | H05K 1/0219 | |
| | | | 439/98 | |
| 2016/0093966 A1* | 3/2016 | Behziz | H05K 1/0219 | |
| | | | 439/607.28 | |
| 2018/0006416 A1* | 1/2018 | Lloyd | H01R 24/60 | |
| 2018/0294076 A1* | 10/2018 | Farkas | H05K 1/0219 | |
| 2018/0337483 A1* | 11/2018 | Henry | H01R 13/40 | |
| 2019/0140374 A1* | 5/2019 | Wu | H01R 12/53 | |
| 2019/0260165 A1* | 8/2019 | Below | H01R 12/596 | |
| 2019/0288457 A1* | 9/2019 | Champion | H01R 12/62 | |
| 2019/0356086 A1* | 11/2019 | Smith | H01R 13/5808 | |
| 2020/0112115 A1* | 4/2020 | Vana, Jr. | H01B 7/0838 | |
| 2020/0194911 A1* | 6/2020 | Ayzenberg | H01R 13/6594 | |
| 2021/0210906 A1* | 7/2021 | Chua | H01R 13/629 | |
| 2021/0234291 A1* | 7/2021 | Zerebilov | H01R 13/405 | |
| 2022/0115821 A1* | 4/2022 | Huang | H01R 12/714 | |
| 2022/0158390 A1* | 5/2022 | Lee | H01R 13/6658 | |

* cited by examiner

CABLE SHIELD FOR AN ELECTRICAL CONNECTOR

BACKGROUND OF THE INVENTION

The subject matter herein relates generally to electrical connectors.

Electrical connectors are used to electrically connect components with an electrical system, such as a data communication system. For example, known electrical systems include plug connectors that are mated with receptacle connectors. Conventional plug connectors are provided at ends of cables, which are terminated to a circuit card of the plug connector. The circuit card is configured to be plugged into a card slot of the receptacle connector. However, known plug connectors have problems with cross talk and return loss, particular when transmitting high speed data signals. For example, signal degradation occurs at the interface between the cables and the circuit card.

A need remains for improved shielding for an electrical connector.

BRIEF DESCRIPTION OF THE INVENTION

In one embodiment, a cable card assembly is provided including a circuit card having a substrate including an upper surface and a lower surface. The substrate includes mating pads at a mating end and cable pads at a cable end. The circuit card has a ground plane. Cables are terminated to the circuit card at the cable end each having signal conductors, an insulator surrounding the signal conductors, and a ground conductor surrounding the insulator. Cable shields are terminated to the ground plane providing electrical shielding for the corresponding cables. Each cable shield includes an end wall between first and second side walls to form a cable cavity. The end wall has a connecting portion between the first and second side walls and a shroud portion extending from the connecting portion covering a portion of the ground conductor. The shroud portion is curved to follow a curvature of the ground conductor and extend along opposite sides of the ground conductor.

In another embodiment, a cable shield for a cable card assembly is provided including a conductive body having a first side wall, a second side wall and an end wall between the first and second side walls. The first and second side walls are configured to be coupled to a circuit card of the cable card assembly. The conductive body forms a cable cavity defined between the first and second side walls configured to receive a cable terminated to the circuit card. The conductive body provides electrical shielding for the cable. The end wall includes a connecting portion between the first and second side walls and a shroud portion extending from the connecting portion. The shroud portion is configured to cover a ground conductor of the cable. The shroud portion includes a solder window configured to receive solder to mechanically and electrically connect the shroud portion of the end wall to the ground conductor of the cable. The shroud portion is curved to follow a curvature of the ground conductor and extend along opposite sides of the ground conductor.

In a further embodiment, an electrical connector is provided including a connector housing having a housing cavity extending between a cable end and a mating end configured to be coupled to a mating electrical connector. The electrical connector includes a cable card assembly received in the housing cavity. The cable card assembly includes a circuit card and cables terminated to the circuit card. The cable card assembly includes cable shields associated with the cables and terminated to the circuit card to provide electrical shielding for the cables. The circuit card includes a substrate including an upper surface and a lower surface. The substrate extends between a mating end and a cable end. The circuit card has mating pads at the mating end and cable pads at the cable end electrically connected to corresponding mating pads. The circuit card has a ground plane. The cables are terminated to the circuit card at the cable end. Each cable has at least one signal conductor and an insulator surrounding the at least one signal conductor. The cable has a ground conductor providing electrical shielding for the at least one signal conductor. The ground conductor surrounding the insulator. The cable shields are terminated to the ground plane of the circuit card at the cable end. The cable shields provide electrical shielding for the corresponding cables. Each cable shield includes a first side wall, a second side wall and an end wall between the first and second side walls. The end wall is spaced apart from the circuit card to form a cable cavity receiving the corresponding cable. The first and second side walls extend from the end wall to the circuit card. The end wall has a connecting portion between the first and second side walls and a shroud portion extending from the connecting portion. The shroud portion covers a portion of the ground conductor. The shroud portion is electrically connected to the ground conductor to electrically common the ground conductor with the ground plane of the circuit card. The shroud portion is curved to follow a curvature of the ground conductor and extend along opposite sides of the ground conductor.

DETAILED DESCRIPTION OF THE INVENTION

Figure 1:
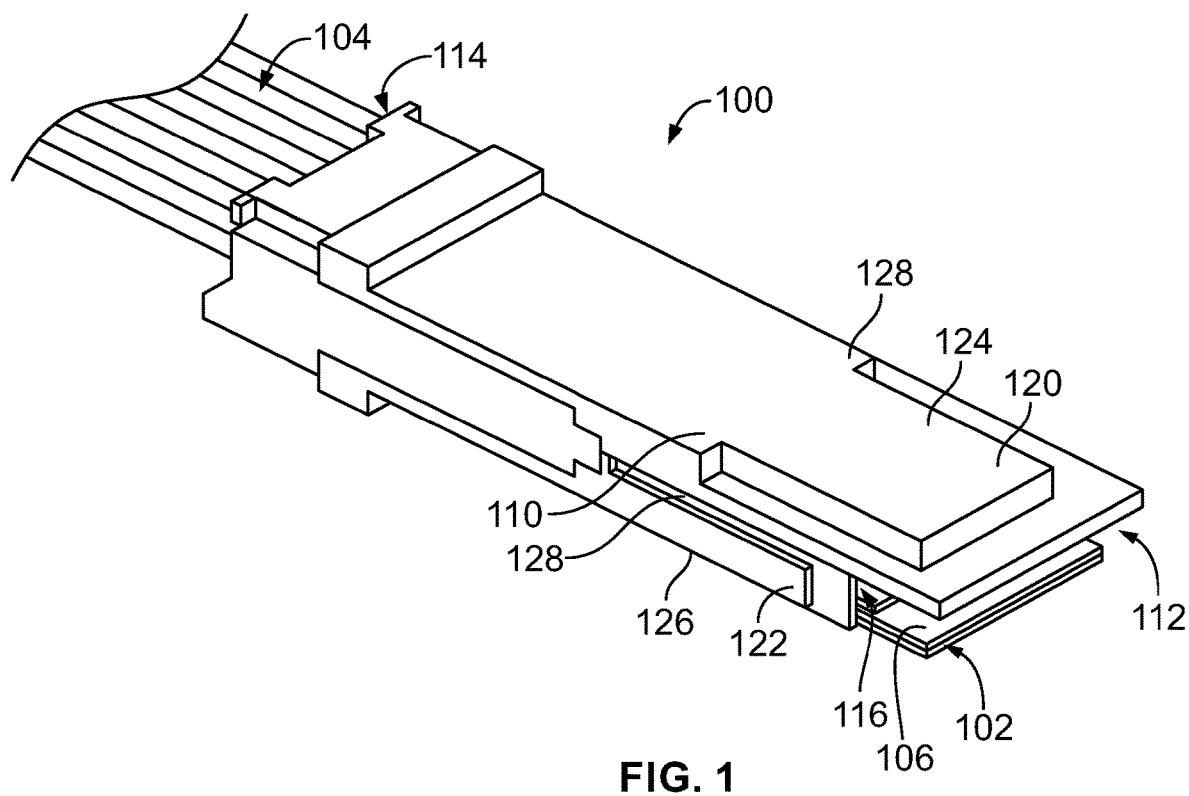
FIG. 1 illustrates an electrical connector including a cable card assembly in accordance with an exemplary embodiment.

FIG. 1 illustrates an electrical connector 100 in accordance with an exemplary embodiment. In the illustrated embodiment, the electrical connector 100 is a pluggable module, such as a transceiver module or an I/O module, configured to be electrically connected to a mating electrical connector (not shown), such as a receptacle connector. In an exemplary embodiment, the electrical connector 100 is a cable connector provided at an end of a cable assembly.

The electrical connector 100 includes a cable card assembly 102. The cable card assembly 102 includes a plurality of cables 104 terminated to a circuit card 106. The circuit card 106 provides an interface between the cables 104 in the mating electrical connector. For example, an edge of the circuit card 106 may be plugged into a card slot of the mating electrical connector. In an exemplary embodiment, the electrical connector 100 includes a connector housing 110 that receives the cable card assembly 102. However, in alternative embodiments, the electrical connector 100 may be provided without the connector housing 110.

The connector housing 110 extends between a mating end 112 and a cable end 114. The cables 104 extend from the cable end 114. The mating end 112 is configured to be mated with the mating electrical connector. In an exemplary embodiment, the connector housing 110 forms a cavity 116 that receives the circuit card 106. The connector housing 110 positions the circuit card 106 in the cavity 116 for mating with the mating electrical connector. In various embodiments, the end of the circuit card 106 may extend out of the cavity 116 and protrude forward of the connector housing 110. In various embodiments, the connector housing 110 may be a multipiece housing. For example, the connector housing 110 may include an upper shell 120 and a lower shell 122 coupled to the upper shell 120. The cavity 116 is formed between the upper shell 120 and the lower shell 122. In the illustrated embodiment, the upper shell 120 forms a top 124 of the connector housing 110 and the lower shell 122 forms a bottom 126 of the connector housing 110. The upper shell 120 and/or the lower shell 122 may form sides 128 of the connector housing 110. In various embodiments, the upper shell 120 and the lower shell 122 are manufactured from a conductive material, such as a metal material. Optionally, the upper and lower shells 120, 122 may be diecast. The upper and lower shells 120, 122 provide electrical shielding for the cable card assembly 102. In an exemplary embodiment, the upper and lower shells 120, 122 may be thermally conductive to dissipate heat from the cable card assembly 102.

Other types of connector housings 110 may be provided in alternative embodiments. For example, the connector housing 110 may be a plastic housing. In various embodiments, the connector housing 110 includes latching features for securing the electrical connector 100 to the mating electrical connector. Optionally, the connector housing 110 may include keying features to guide mating of the electrical connector 100 with the mating electrical connector.

Figure 2:
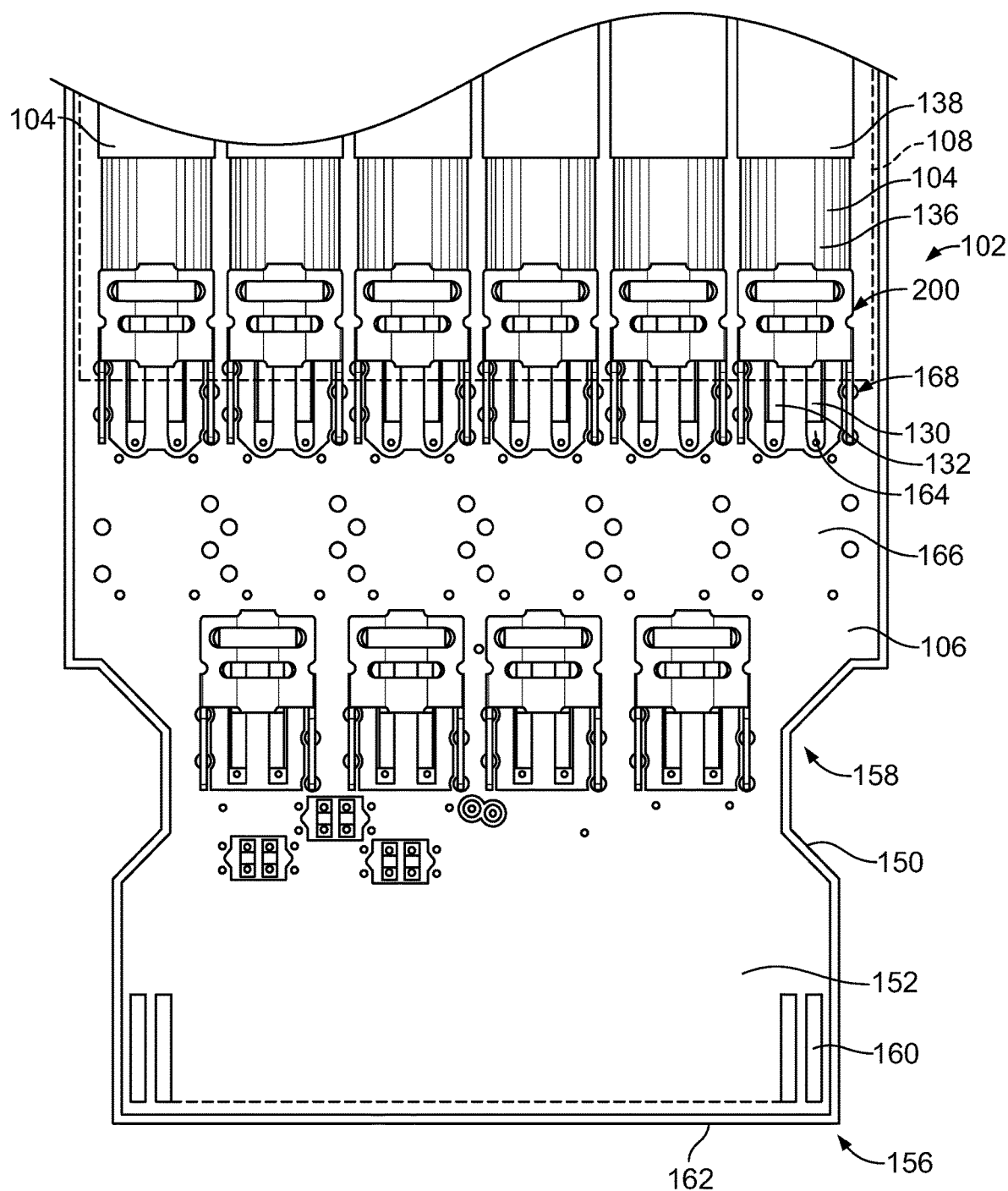
FIG. 2 is a top view of the cable card assembly in accordance with an exemplary embodiment.
Figure 3:
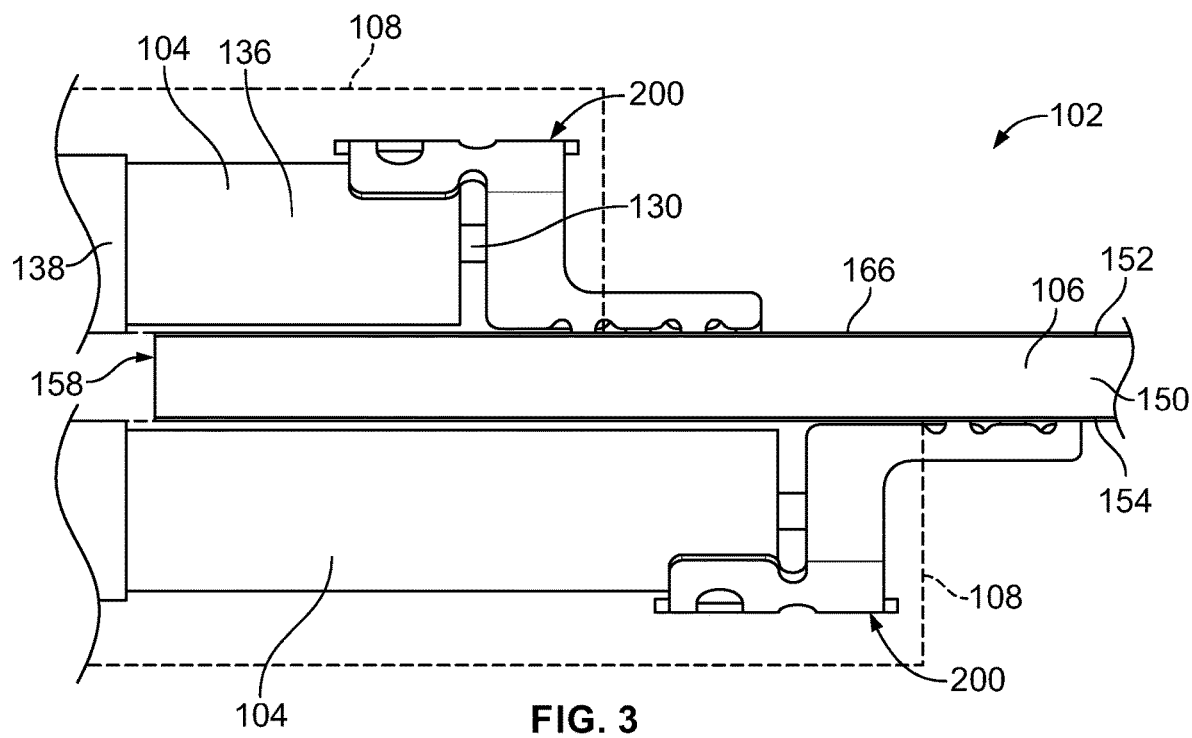
FIG. 3 is a side view of a portion of the cable card assembly in accordance with an exemplary embodiment.

FIG. 2 is a top view of the cable card assembly 102 in accordance with an exemplary embodiment. FIG. 3 is a side view of a portion of the cable card assembly 102 in accordance with an exemplary embodiment. The cable card assembly 102 includes the circuit card 106 and the cables 104 terminated to the circuit card 106. Some of the cables 104 are removed in FIG. 2 to illustrate the components of the cable card assembly 102. In an exemplary embodiment, the circuit card assembly 102 includes a strain relief member 108 (shown in phantom). The strain relief member 108 is coupled to the cables 104. The strain relief member 108 may be coupled to the circuit card 106. The strain relief member 108 may be an overmold that is formed in place over the cables 104 to secure the cables 104 to each other and/or to the circuit card 106.

The cables 104 are high speed signal cables. In an exemplary embodiment, the cables 104 are twinaxial cables each having a pair of signal conductors. However, in alternative embodiments, the cables 104 may be coaxial cables having a single signal conductor. In the illustrated embodiment, each cable 104 includes a first signal conductor 130 and a second signal conductor 132. The signal conductors 130, 132 transmit differential signals and form a differential pair. The signal conductors 130, 132 are held by an insulator 134 (shown in FIG. 8) within a bore of the cable 104. A ground conductor 136 surrounds the insulator 134. The ground conductor 136 may be a foil or tape wrapped around the insulator 134. The ground conductor 136 provides electrical shielding for the signal conductors 130, 132 along the length of the cable 104. A cable jacket 138 surrounds the ground conductor 136.

During assembly, the end of the cable 104 is prepared by removing a portion of the cable jacket 138 to expose the ground conductor 136 along a length at the end of the cable. A portion of the ground conductor 136 in the insulator 134 is removed to expose ends of the signal conductors 130, 132. The signal conductors 130, 132 are configured to be soldered to the circuit card 106. In an exemplary embodiment, a cable shield 200 is used to electrically connect the ground conductor 136 to the circuit card 106. The cable shield 200 may provide a mechanical and electrical connection between the cable 104 and the circuit card 106. The cable shield 200 provides electrical shielding for the signal conductors 130, 132 to reduce crosstalk between adjacent cables 104.

The circuit card 106 is a layered circuit board structure in an exemplary embodiment. The circuit card 106 includes a substrate 150, which may include multiple layers. The substrate 150 has an upper surface 152 and a lower surface 154. The substrate 150 extends between a mating end 156 and a cable end 158 of the circuit card 106. The cables 104 are terminated to the circuit card 106 at the cable end 158. The mating end 156 is configured to be mated with the mating electrical connector.

In an exemplary embodiment, the circuit card 106 includes mating pads 160 at the mating end 156. The mating pads 160 are circuits or conductors of the circuit card 106. The mating pads 160 are provided proximate to a mating edge 162 of the circuit card 106, which is configured to be plugged into a card slot of the mating electrical connector. Optionally, the mating pads 160 may be provided at the upper surface 152 and/or the lower surface 154. The mating pads 160 may be signal conductors and/or ground conductors.

In an exemplary embodiment, the circuit card 106 includes cable pads 164 at the cable end 158. The cable pads 164 are circuits or conductors of the circuit card 106. The cable pads 164 are electrically connected to corresponding mating pads 160, such as through vias, traces, and other circuits of the circuit card 106. Optionally, the cable pads 164 may be provided at the upper surface 152 and/or the lower surface 154. The cable pads 164 may be provided in multiple rows are staggered between the front and the rear of the circuit card 106. In an exemplary embodiment, the cable pads 164 are arranged in pairs. The signal conductors 130, 132 of the cables 104 are terminated to corresponding cable pads 164, such as by soldering the signal conductors 130, 132 to the cable pads 164.

In an exemplary embodiment, the circuit card 106 includes one or more ground planes 166 at one or more layers of the substrate 150. For example, the ground planes 166 may be provided at the upper surface 152 and the lower surface 154. The ground planes 166 provide electrical shielding for the circuit card 106. In an exemplary embodiment, the cable shields 200 are terminated to the ground planes 166. For example, the cable shields 200 may be press-fit into ground vias 168 in the circuit card 106, which are electrically connected to the ground planes 166. The cable shield 200 may additionally, or alternatively, the soldered to the ground vias 168 and/or the ground plane 166.

Figure 4:
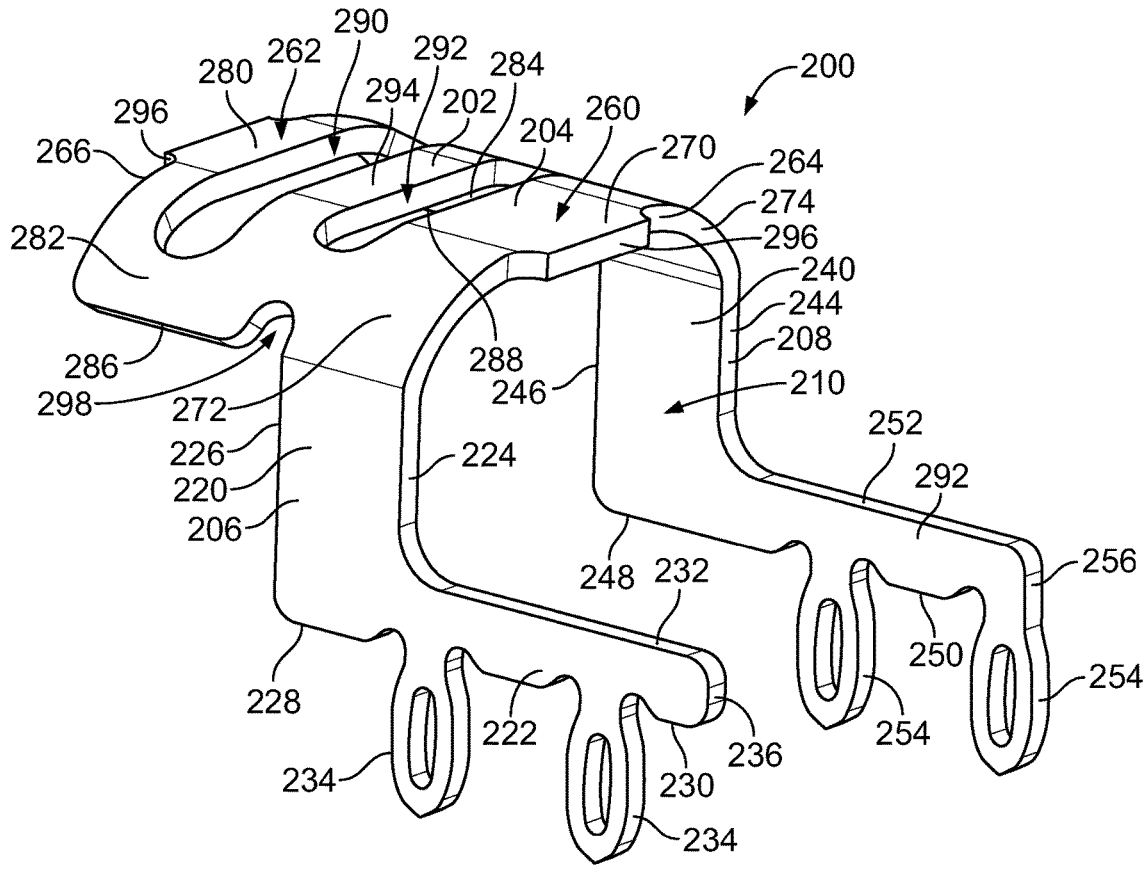
FIG. 4 is a perspective view of a cable shield of the cable card assembly in accordance with an exemplary embodiment.
Figure 5:
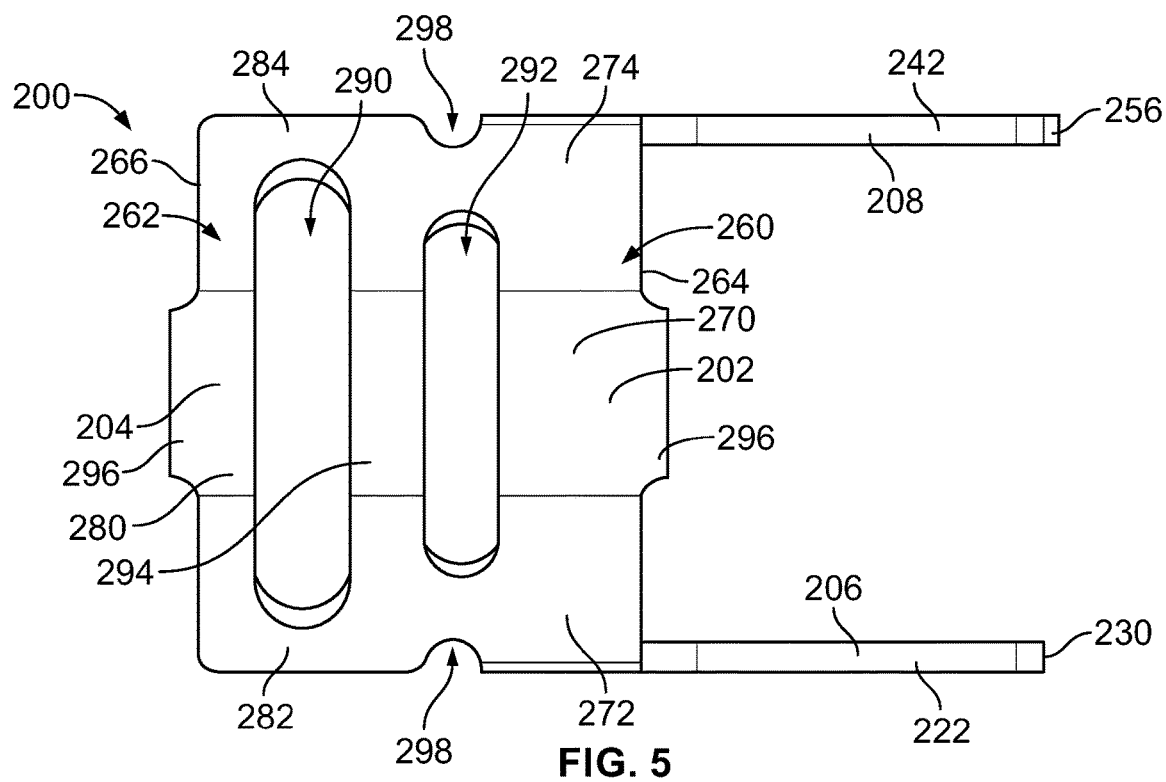
FIG. 5 is a top view of the cable shield in accordance with an exemplary embodiment.
Figure 6:
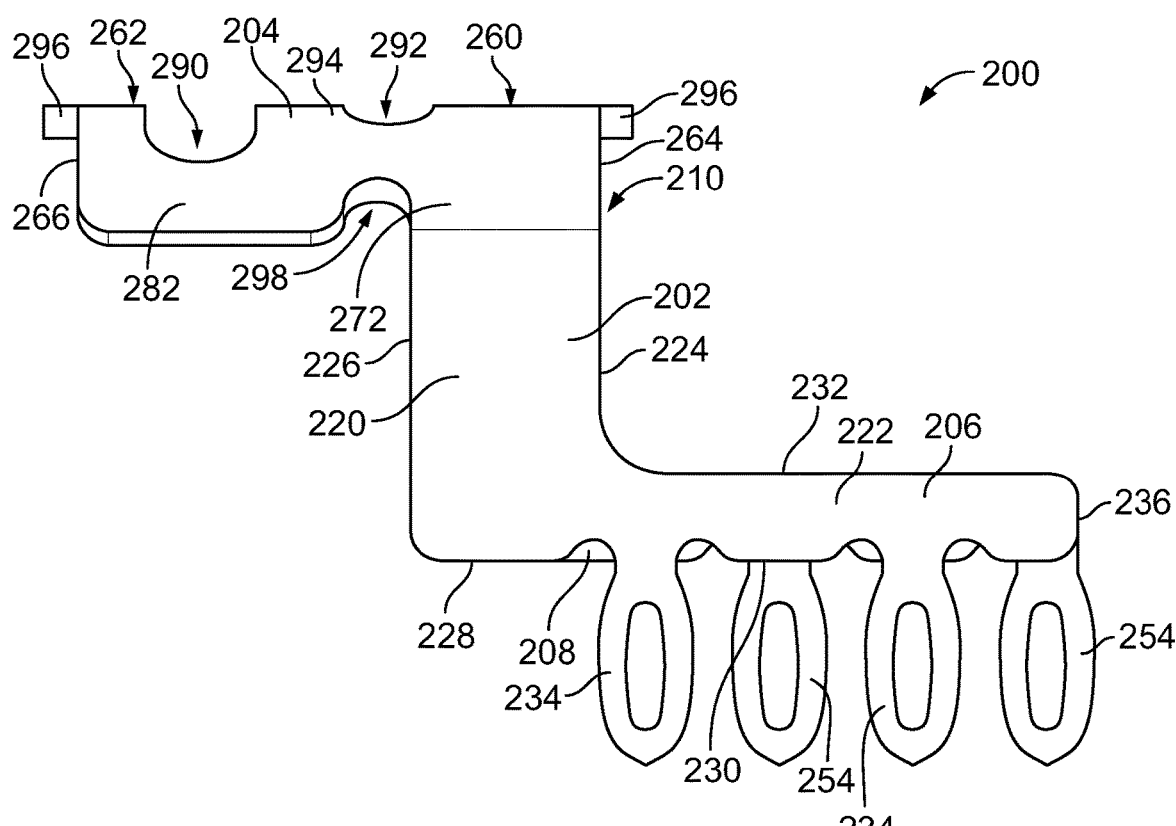
FIG. 6 is a side view of the cable shield in accordance with an exemplary embodiment.

FIG. 4 is a perspective view of the cable shield 200 in accordance with an exemplary embodiment. FIG. 5 is a top view of the cable shield 200 in accordance with an exemplary embodiment. FIG. 6 is a side view of the cable shield 200 in accordance with an exemplary embodiment. The cable shield 200 includes a conductive body 202 that forms an electrical conductor between the cable 104 and the circuit card 106 (both shown in FIG. 2). In various embodiments, the conductive body 202 is a stamped and formed body, which may be stamped from a metal plate and then formed into a particular shape.

The cable shield 200 includes an end wall 204, a first side wall 206 extending from a first side of the end wall 204 and a second side wall 208 extending from a second side of the end wall 204. The end wall 204 and the side walls 206, 208 form a cable cavity 210 that receives the cable 104. The end wall 204 and the side walls 206, 208 provide electrical shielding around the cable cavity 210. The end wall 204 extends generally horizontally between the side walls 206, 208, while the side walls 206, 208 extend generally vertically from the end wall 204. In an exemplary embodiment, the sides of the end wall 204 are curved to transition to the first and second side walls 206, 208. The curvature of the end wall 204 may be designed to follow a curvature of the cable 104, as explained in further detail below. In a first orientation, the end wall 204 is a top wall that extends across a top of the cable 104, while the side walls 206, 208 extend downwardly along sides of the cables 104 to interface with the circuit card 106. In a second orientation, the end wall 204 is a bottom wall that extends across a bottom of the cable 104, while the side walls 206, 208 extend upwardly along the sides of the cables 104 to interface with the circuit card 106. Other orientations are possible in alternative embodiments.

The first side wall 206 includes an arm 220 and a finger 222 extending forward from the arm 220. In the illustrated embodiment, the first side wall 206 is L-shaped with the finger 222 being oriented generally perpendicular relative to the arm 220. The arm 220 includes a front edge 224 and a rear edge 226 opposite the front edge 224. The finger 222 extends forward from the front edge 224. The arm 220 extends from the end wall 204 to an inner edge 228. The inner edge 228 is configured to face the circuit card 106 and may abut against the circuit card 106 when the cable shield 200 is coupled to the circuit card 106. Optionally, the rear edge 226 may extend vertically between the end wall 204 and the inner edge 228. However, the rear edge 226 may have other shapes in alternative embodiments, such as being angled or curved rearwardly from the inner edge 228 to transition into the end wall 204.

In an exemplary embodiment, the finger 222 extends forward from the arm 220 at the inner edge 228. For example, the finger 222 includes an inner edge 230 and an outer edge 232 opposite the inner edge 230. The height of the finger 222 between the inner and outer edges 230, 232 may be equal to or greater than a diameter (for example, height) of the signal conductors 130, 132 of the cable 104 to provide shielding between the signal conductors 130, 132 of adjacent cables 104. The inner edge 230 may be generally coplanar with the inner edge 228 of the arm 220. The inner edge 230 faces the circuit card 106 and may abut against the circuit card 106 when the cable shield 200 is coupled to the circuit card 106. In an exemplary embodiment, the cable shield 200 includes mounting pins 234 extending from the inner edge 230. The mounting pins 234 are used for mounting the cable shield 200 to the circuit card 106 in the illustrated embodiment, the mounting pins 234 are compliant pins, such as eye-of-the-needle pins. Other types of mounting pins may be used in alternative embodiments, such as solder pins. The finger 222 extends from the arm 220 to a distal end 236. Optionally, multiple mounting pins 234 may be provided along the finger 222 between the arm 220 and the distal end 236. In other various embodiments, the arm 220 may additionally, or alternatively, include mounting pins.

The second side wall 208 includes an arm 240 and a finger 242 extending forward from the arm 240. In the illustrated embodiment, the second side wall 208 is L-shaped with the finger 242 being oriented generally perpendicular relative to the arm 240. The arm 240 includes a front edge 244 and a rear edge 246 opposite the front edge 244. The finger 242 extends forward from the front edge 244. The arm 240 extends from the end wall 204 to an inner edge 248. The inner edge 248 is configured to face the circuit card 106 and may abut against the circuit card 106 when the cable shield 200 is coupled to the circuit card 106. Optionally, the rear edge 246 may extend vertically between the end wall 204 and the inner edge 248. However, the rear edge 246 may have other shapes in alternative embodiments, such as being angled or curved rearwardly from the inner edge 248 to transition into the end wall 204.

In an exemplary embodiment, the finger 242 extends forward from the arm 240 at the inner edge 248. For example, the finger 242 includes an inner edge 250 and an outer edge 252 opposite the inner edge 250. The inner edge 250 may be generally coplanar with the inner edge 248 of the arm 240. The inner edge 250 faces the circuit card 106 and may abut against the circuit card 106 when the cable shield 200 is coupled to the circuit card 106. In an exemplary embodiment, the cable shield 200 includes mounting pins 254 extending from the inner edge 250. The mounting pins 254 are used for mounting the cable shield 200 to the circuit card 106 in the illustrated embodiment, the mounting pins 254 are compliant pins, such as eye-of-the-needle pins. Other types of mounting pins may be used in alternative embodiments, such as solder pins. The finger 242 extends from the arm 242 a distal end 256. Optionally, multiple mounting pins 254 may be provided along the finger 242 between the arm 240 and the distal end 256. In an exemplary embodiment, the mounting pins 254 may be offset or stacker relative to the mounting pins 234 of the first side wall 206. In other various embodiments, the arm 240 may additionally, or alternatively, include mounting pins.

The end wall 204 includes a connecting portion 260 between the first side wall 206 and the second side wall 208. For example, the connecting portion 260 extends between the arm 220 and the arm 240. The end wall 204 includes a shroud portion 262 extending rearward from the connecting portion 260. The connecting portion 260 includes a front edge 264 and defines a front of the end wall 204. The shroud portion 262 includes a rear edge 266 that defines a rear of the end wall 204. Optionally, the front edge 264 of the connecting portion 260 may be generally aligned flush with the front edges 224, 244 of the arms 220, 240. Alternatively, the front edge 264 may protrude forwardly or be recessed rearwardly relative to the front edges 224, 244 of the arms 220, 240.

In an exemplary embodiment, the connecting portion 260 includes a central panel 270, a first transition panel 272 at a first side of the central panel 270, and a second transition panel 274 at a second side of the central panel 270. The central panel 270 may be generally flat or planar. The first transition panel 272 transitions between the central panel 270 and the first side wall 206. In an exemplary embodiment, the first transition panel 272 is curved between the central panel 270 and the first side wall 206. For example, the central panel 270 may be oriented horizontally and the first side wall 206 is oriented vertically (for example, perpendicular to the central panel 270) with the first transition panel 272 having a smooth curvature between the central panel 270 and the first side wall 206. The second transition panel 274 transitions between the central panel 270 and the second side wall 208 in an exemplary embodiment, the second transition panel 274 is curved between the central panel 270 and the second side wall 208. For example, the second side wall 208 may be oriented perpendicular to the central panel 270 with the second transition panel 274 having a smooth curvature between the central panel 270 and the second side wall 208.

In an exemplary embodiment, the shroud portion 262 includes a central panel 280, a first side tab 282 at a first side of the central panel 280, and a second side tab 284 at a second side of the central panel 280. The central panel 280 is aligned with the central panel 270. The central panel 280 may be generally flat or planar. The first side tab 282 extends from the central panel 280 to a first edge 286 of the shroud portion 262. In an exemplary embodiment, the first side tab 282 is curved between the central panel 280 and the first edge 286. For example, the first side tab 282 may have a smooth curvature that mimics a curvature of the cable 104 between the central panel 280 and the first edge 286. The second side tab 284 extends from the central panel 280 to a second edge 288 of the shroud portion 262. In an exemplary embodiment, the second side tab 284 is curved between central panel 280 and the second edge 288. For example, the second side tab 284 may have a smooth curvature that mimics a curvature the cable 104 between central panel 280 and the second edge 288.

In an exemplary embodiment, the first edge 286 is aligned with the intersection between the first side wall 206 and the first transition panel 272. For example, the cable shield 200 may be open rearward of the rear edge 226 of the first side wall 206. In an exemplary embodiment, the second edge 288 is aligned with the intersection between the second side wall 208 and the second transition panel 274. For example, the cable shield 200 may be open rearward of the rear edge 246 of the second side wall 208. Having the cable shield 200 open below the first and second edges 286, 288 rearward of the first and second side walls 206, 208 reduces material, and thus cost, of the cable shield 200 while also having the first and second sides tabs 282, 284 to provide electrical shielding along the sides of the cable 104.

The cable shield 200 includes a solder window 290 in the shroud portion 262. The solder window 290 is formed by an opening or slot formed in the shroud portion 262. Optionally, the solder window 290 may be elongated in a direction parallel to the rear edge 266. The solder window 290 may be formed during the stamping process. The solder window 290 extends entirely through the cable shield 200. The solder window 290 is configured to receive solder to mechanically and electrically connect the cable shield 200 to the ground conductor of the cable 104. In the illustrated embodiment, the solder window 290 extends entirely across the central panel 280. The solder window 290 may extend partially across the first side tab 282 and/or partially across the second side tab 284. For example, the solder window 290 may extend along the curved portions of the shroud portion 262. In the illustrated embodiment, the solder window 290 extends across a majority of a width of the shroud portion 262.

In an exemplary embodiment, the cable shield 200 includes a relief slot 292 forward of the solder window 290. The relief slot 292 provides a thermal break along the end wall 204 to prevent overheating of the cable shield 200 and/or the solder and/or the ground conductor 136 of the cable 104 during the soldering process. The thermal break reduces heat dissipation through the conductive body 202 of the cable shield 200. The soldering process allows the heating of the material to be focused in the material surrounding the solder window 290, which may lead to a quicker soldering process and/or a reduction in the amount of heat energy needed to complete the soldering process. The relief slot 292 is formed by an opening formed in the shroud portion 262. The relief slot 292 may be formed during the stamping process. The relief slot 292 extends entirely through the cable shield 200. Optionally, the relief slot 292 may be elongated in a direction parallel to the rear edge 266. For example, the relief slot 292 may be parallel to the solder window 290 and spaced apart from the solder window 290 by a crossbeam 294 extending between the first and second sides tabs 282, 284. In the illustrated embodiment, the relief slot 292 extends entirely across the central panel 280. The relief slot 292 extend partially across the first side tab 282 and/or partially across the second side tab 284. Optionally, the relief slot 292 may have a length less than a length of the solder window 290. Optionally, the relief slot 292 may have a width less than a width of the solder window 290. In the illustrated embodiment, the relief slot 292 is located proximate to the intersection between the shroud portion 262 in the shroud portion 262. Optionally, the relief slot 292 may at least partially extend into the connecting portion 260.

In an exemplary embodiment, the cable shield 200 includes one or more carrier tabs 296 that are used to connect the cable shield 200 to a carrier strip during the manufacturing process. For example, the cable shield 200 may be cut away from the carrier strip during a stamping process. In an exemplary embodiment, the cable shield 200 includes forming pockets 298 between the sides tabs 282, 284 and the side walls 206, 208. The forming pockets 298 are formed during a stamping process. The forming pockets 298 provide a gap or space between the sides tabs 282, 284 and the side walls 206, 208 to allow proper forming of the cable shield 200 during the forming process. For example, the sides tabs 282, 284 may be bent or formed separately from the side walls 206, 208.

Figure 7:
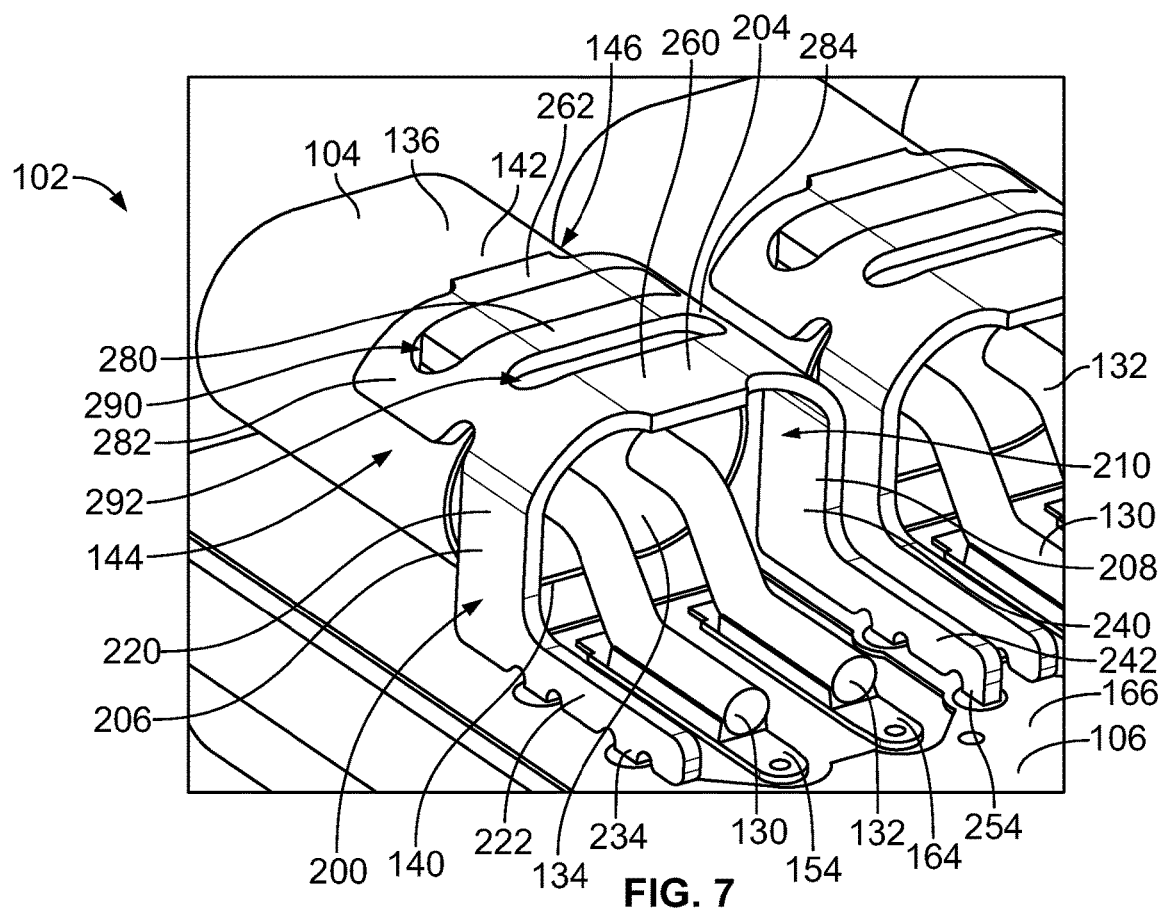
FIG. 7 is a front perspective view of a portion of the cable card assembly in accordance with an exemplary embodiment.
Figure 8:
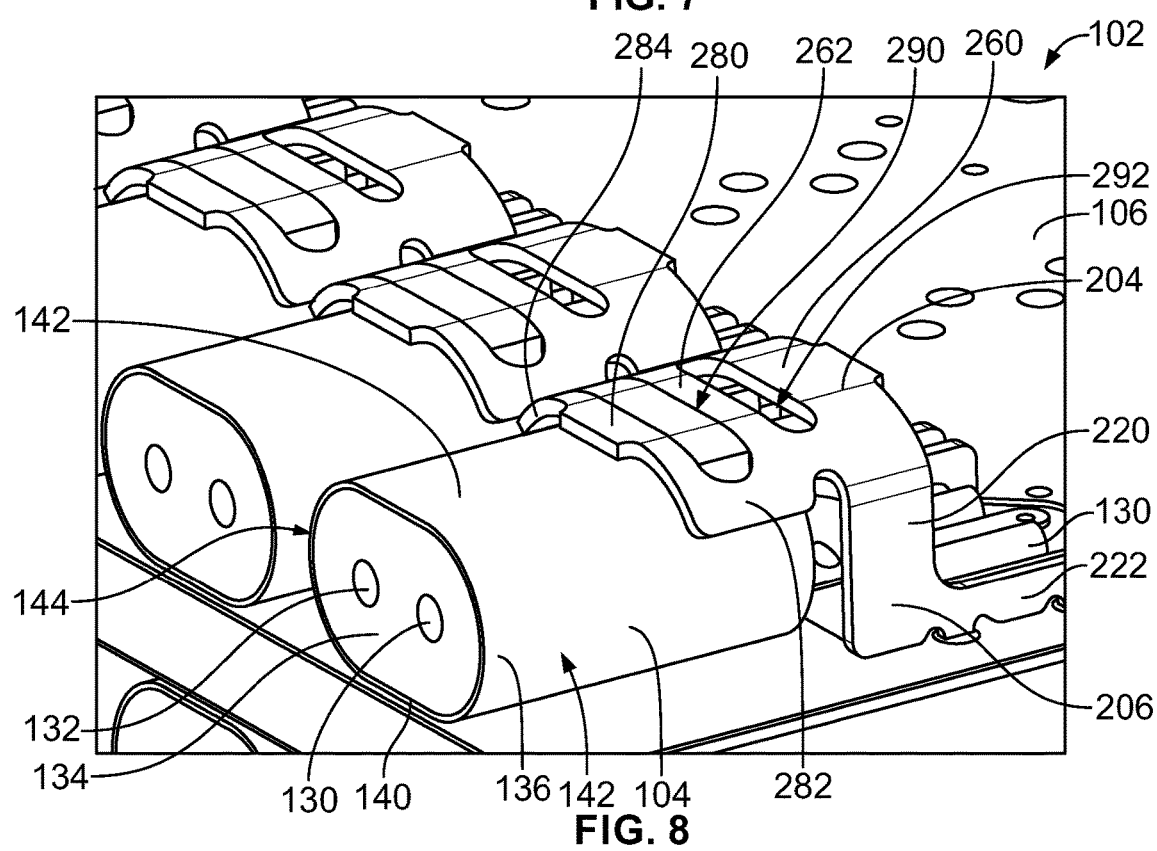
FIG. 8 is a rear perspective view of a portion of the cable card assembly in accordance with an exemplary embodiment.
Figure 9:
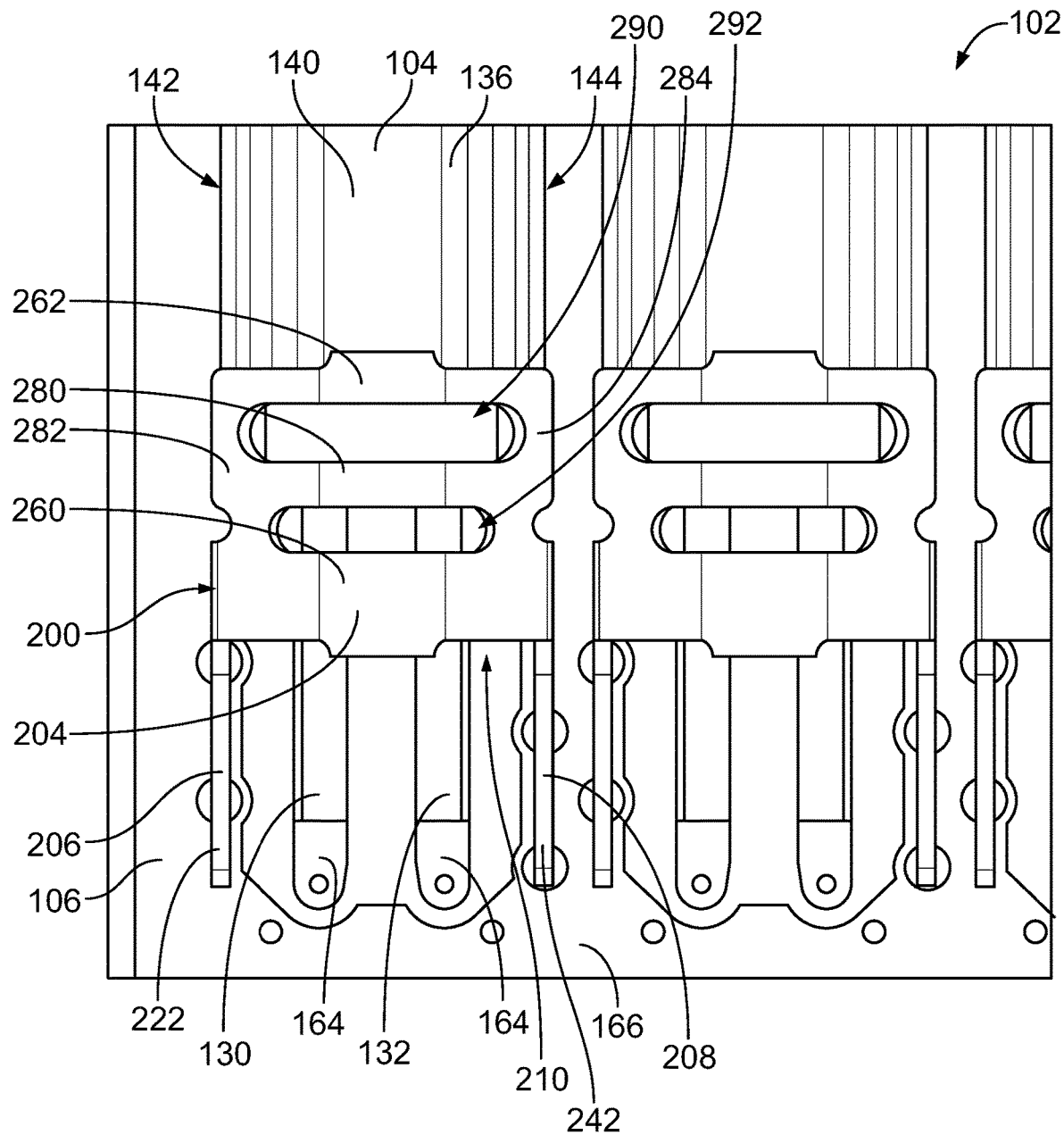
FIG. 9 is a top view of a portion of the cable card assembly in accordance with an exemplary embodiment.

FIG. 7 is a front perspective view of a portion of the cable card assembly 102 in accordance with an exemplary embodiment. FIG. 8 is a rear perspective view of a portion of the cable card assembly 102 in accordance with an exemplary embodiment. FIG. 9 is a top view of a portion of the cable card assembly 102 in accordance with an exemplary embodiment.

During assembly, the cables 104 are terminated to the circuit card 106. For example, the exposed to ends of the signal conductors 130, 132 are soldered to corresponding cable pads 164 of the circuit card 106. The cable shields 200 are coupled to the circuit card 106 either prior to or after the cables 104 are terminated to the circuit card 106. In an exemplary embodiment, the mounting pins 234 are used to mechanically and electrically connect the cable shields 200 to the circuit card 106. For example, the mounting pins 234 may be press-fit into vias formed in the circuit card 106 to electrically connect the cable shields 200 to the ground plane 166. Once the cables 104 and the cable shields 200 are coupled to the circuit card 106 the cable shields 200 may be connected to the cables 104. For example, the cable shields 200 are soldered to the ground conductors 136 of the corresponding cables 104. The solder windows 290 are filled with the solder material to solder the cable shields 200 to the ground conductors 136. The cable shields 200 electrically connect the ground conductors 136 to the ground plane 166 of the circuit card 106.

In an exemplary embodiment, the cable shield 200 is positioned relative to the cable 104 such that the cable shield 200 covers at least a portion of the ground conductor 136. For example, the shroud portion 262 may extend along the ground conductor 136. In an exemplary embodiment, at least a portion of the cable shield 200 extends forward of the end of the insulator 134 to provide shielding for the exposed portions of the signal conductors 130, 132. For example, the connecting portion 260 of the end wall 204 and the side walls 206, 208 are located forward of the end of the insulator 134. The arms 220, 240 of the side walls 206, 208 provide electrical shielding between the pairs of signal conductors 130, 132 as the signal conductors 130, 130 to transition from the insulator 134 to the cable pads 164. The fingers 222, 242 of the side walls 206, 208 provide electrical shielding between the pairs of signal conductors 130, 132 of adjacent cables 104. For example, the fingers 222, 242 extend along the cable pads 164 to provide shielding for the portions of the signal conductors 130, 132 that are soldered to the cable pads 164. The side walls 206, 208 of the cable shields 200 provide shielding along the sides of the signal conductors 130, 132. The side walls 206, 208 reduce crosstalk between the signal conductors 130, 132 of the adjacent cables 104.

In an exemplary embodiment, the cable cavity 210 of the cable shield 200 is sized and shaped to receive the cable 104. For example, the shroud portion 262 of the end wall 204 may have a complementary size and shape as the cable 104 to receive the cable 104. For example, the central panel 280 and the first and second sides tabs 282, 284 may be shaped to abuttingly receive the ground conductor 136 of the cable 104 to provide good electrical connection between the cable shield 200 and the ground conductor 136 of the cable 104. The curvature of the side tabs 282, 284 may mimic the curvature of the ground conductor 136 of the cable 104.

In an exemplary embodiment, the cable 104 includes an inner end 140, an outer end 142, and opposite sides 144, 146 extending between the inner and outer ends 140, 142. The inner end 140 faces the circuit card 106. The outer end 142 is opposite the inner end 140. In an exemplary embodiment, the inner end 140 and the outer end 142 are flat. The sides 144, 146 are curved between the flat inner end 140 and the flat outer end 142. The cable is shaped with the flat ends 140, 142 for impedance control of the pair of signal conductors 130, 132. The shroud portion 262 matches the shape of the cable 104. For example, the central panel 280 is flat to engage the flat outer end 142. The side tabs 282, 284 are curved to match the curvature of the sides 144, 146, respectively. The side tabs 282, 284 are curved around the sides 144, 146 of the cable 104 to provide some shielding along the sides 144, 146 of the cable 104. In the illustrated embodiment, the side tabs 282, 284 cover approximately half of the sides 144, 146 of the cable 104. The side tabs 282, 284 may cover a greater or lesser amount of the sides 144, 146 in alternative embodiments.

The relief slot 292 is located forward of the solder window 290. In an exemplary embodiment, the relief slot 292 is located forward of the end of the insulator 134. As such, the relief slot 292 is aligned with the exposed ends of the signal conductors 130, 132. The relief slot 292 may be sized and shaped for impedance control in the area where the signal conductors 130, 132 transition from the insulator 134. For example, the impedance of the signals along the signal conductors 130, 132 as the signal conductors 130, 132 of the insulator 134 may be increased. The relief slot 292 is provided to decrease the impedance at the area where the signal conductors 130, 132 exit the insulator 134. As such, the relief slot 292 may be used to reduce the return loss of the signals compared to a cable shield that is not include a relief slot.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable card assembly comprising:
a circuit card having a substrate including an upper surface and a lower surface, the substrate extending between a mating end and a cable end, the circuit card having mating pads at the mating end, the circuit card having cable pads at the cable end, the cable pads being electrically connected to corresponding mating pads, the circuit card having a ground plane;
cables terminated to the circuit card at the cable end, each cable having at least one signal conductor and an insulator surrounding the at least one signal conductor, the cable having a ground conductor providing electrical shielding for the at least one signal conductor, the ground conductor surrounding the insulator; and
cable shields terminated to the ground plane of the circuit card at the cable end, the cable shields providing electrical shielding for the corresponding cables, each cable shield including a first side wall, a second side wall and an end wall between the first and second side walls, the end wall being spaced apart from the circuit card to form a cable cavity receiving the corresponding cable, the first and second side walls extending from the end wall to the circuit card, the end wall having a connecting portion between the first and second side walls and a shroud portion extending from the connecting portion, the shroud portion covering a portion of the ground conductor, the shroud portion being electrically connected to the ground conductor to electrically common the ground conductor with the ground plane of the circuit card, the shroud portion being curved to follow a curvature of the ground conductor and extend along opposite sides of the ground conductor, wherein the shroud portion includes a central panel, a first side tab extending from the central panel, and a second side tab extending from the central panel opposite the first side tab, the first and second side tabs being curved to follow the curvature of corresponding sides of the ground conductor.

2. The cable card assembly of claim 1, wherein the cable shield includes a solder window at the shroud portion receiving solder to mechanically and electrically connect the cable shield to the ground conductor of the cable.

3. The cable card assembly of claim 2, wherein the solder window extends along the curved portions of the shroud portion along the sides of the ground conductor.

4. The cable card assembly of claim 2, further comprising a relief slot forward of the solder window, the relief slot providing a thermal break for the connecting portion.

5. The cable card assembly of claim 4, wherein the solder window is at least one of wider or longer than the relief slot.

6. The cable card assembly of claim 1, wherein the ground conductor includes an inner end and an outer end, the sides of the ground conductor extending between the inner end and the outer end, the inner end and the outer end being flat, the sides being curved.

7. The cable card assembly of claim 6, wherein the first side tab extends along a minority of the corresponding side of the ground conductor and the second side tab extends along a minority of the corresponding side of the ground conductor.

8. The cable card assembly of claim 6, wherein the first side tab is located rearward of the first side wall of the cable shield and the second side tab is located rearward of the second side wall of the cable shield.

9. The cable card assembly of claim 8, wherein the first side wall is located forward of an end of the insulator of the cable, the central panel and the first and second sides tabs extending along the insulator and the ground conductor surrounding the insulator.

10. The cable card assembly of claim 1, wherein the first side wall includes an arm extending generally downward from the end wall and a finger extending generally forward from the arm, the first side wall extending parallel to, and spaced apart from, the at least one signal conductor of the cable to provide electrical shielding between the at least one signal conductor and the at least one signal conductor of the cable adjacent thereto, and wherein the second side wall includes an arm extending generally downward from the end wall and a finger extending generally forward from the arm, the second side wall extending parallel to, and spaced apart from, the at least one signal conductor of the cable to provide electrical shielding between the at least one signal conductor and the at least one signal conductor of the cable adjacent thereto.

11. A cable shield for a cable card assembly, the cable shield comprising:
a conductive body having a first side wall, a second side wall and an end wall between the first and second side walls, the first and second side walls configured to be coupled to a circuit card of the cable card assembly, the conductive body forming a cable cavity defined between the first and second side walls configured to receive a cable terminated to the circuit card, the conductive body providing electrical shielding for the cable;
wherein the end wall includes a connecting portion between the first and second side walls and a shroud portion extending from the connecting portion, the shroud portion configured to cover a ground conductor of the cable, the shroud portion including a solder window configured to receive solder to mechanically and electrically connect the shroud portion of the end wall to the ground conductor of the cable, the shroud portion being curved to follow a curvature of the ground conductor and extend along opposite sides of the ground conductor, wherein the solder window extends along the curved portions of the shroud portion along the sides of the ground conductor.

12. The cable shield of claim 11, further comprising a relief slot forward of the solder window, the relief slot providing a thermal break for the connecting portion.

13. The cable shield of claim 11, wherein the shroud portion includes a central panel, a first side tab extending from the central panel, and a second side tab extending from the central panel opposite the first side tab, the first and second side tabs being curved to follow the curvature of the corresponding sides of the ground conductor.

14. The cable shield of claim 13, wherein the first side tab is located rearward of the first side wall of the cable shield and the second side tab is located rearward of the second side wall of the cable shield.

15. The cable shield of claim 11, wherein the first side wall includes an arm extending generally downward from the end wall and a finger extending generally forward from the arm, the first side wall extending parallel to, and spaced apart from, the at least one signal conductor of the cable to provide electrical shielding between a signal conductor of the cable and a signal conductor of an adjacent cable, and wherein the second side wall includes an arm extending generally downward from the end wall and a finger extending generally forward from the arm, the second side wall extending parallel to, and spaced apart from, the conductor of the cable to provide electrical shielding between the conductor and a signal conductor of an adjacent cable.

16. An electrical connector comprising:
a connector housing extending between a mating end and a cable end, the mating end configured to be coupled to a mating electrical connector, the connector housing having a housing cavity; and
a cable card assembly received in the housing cavity, the cable card assembly including a circuit card and cables terminated to the circuit card, the cable card assembly including cable shields associated with the cables and terminated to the circuit card to provide electrical shielding for the cables;
wherein the circuit card includes a substrate including an upper surface and a lower surface, the substrate extending between a mating end and a cable end, the circuit card having mating pads at the mating end, the circuit card having cable pads at the cable end, the cable pads being electrically connected to corresponding mating pads, the circuit card having a ground plane;
wherein the cables are terminated to the circuit card at the cable end, each cable having at least one signal conductor and an insulator surrounding the at least one signal conductor, the cable having a ground conductor providing electrical shielding for the at least one signal conductor, the ground conductor surrounding the insulator, the ground conductor including an inner end and an outer end, the inner end and the outer end being flat, sides of the ground conductor extending between the inner end and the outer end, the sides being curved; and
wherein the cable shields are terminated to the ground plane of the circuit card at the cable end, the cable shields providing electrical shielding for the corresponding cables, each cable shield including a first side wall, a second side wall and an end wall between the first and second side walls, the end wall being spaced apart from the circuit card to form a cable cavity receiving the corresponding cable, the first and second side walls extending from the end wall to the circuit card, the end wall having a connecting portion between the first and second side walls and a shroud portion extending from the connecting portion, the shroud portion covering the outer end and portions of the sides of the ground conductor, the shroud portion being electrically connected to the ground conductor to electrically common the ground conductor with the ground plane of the circuit card, the shroud portion being curved to follow a curvature of the sides of the ground conductor and extend along the curved sides of the ground conductor.

17. The electrical connector of claim 16, wherein the cable shield includes a solder window at the shroud portion receiving solder to mechanically and electrically connect the cable shield to the ground conductor of the cable.

18. The electrical connector of claim 16, wherein the shroud portion including a central panel extending along the outer end of the ground conductor, the shroud portion including a first side tab extending from the central panel along the corresponding side of the ground conductor, and the shroud portion including a second side tab extending from the central panel opposite the first side tab along the corresponding side of the ground conductor, the first and second side tabs being curved to follow the curvature of the corresponding sides of the ground conductor.

19. The electrical connector of claim 16, wherein the cable shield includes a solder window at the shroud portion receiving solder, the solder window extending along the curved portions of the shroud portion along the sides of the ground conductor.

20. The electrical connector of claim 16, wherein the first side wall includes an arm extending generally downward from the end wall and a finger extending generally forward from the arm, the first side wall extending parallel to, and spaced apart from, the at least one signal conductor of the cable to provide electrical shielding between a signal conductor of the cable and a signal conductor of an adjacent cable, and wherein the second side wall includes an arm extending generally downward from the end wall and a finger extending generally forward from the arm, the second side wall extending parallel to, and spaced apart from, the conductor of the cable to provide electrical shielding between the conductor and a signal conductor of an adjacent cable.

* * * * *